United States Patent
Ebuchi et al.

(10) Patent No.: US 8,265,195 B2
(45) Date of Patent: Sep. 11, 2012

(54) HYBRID DATA TRANSMISSION CIRCUIT

(75) Inventors: Tsuyoshi Ebuchi, Osaka (JP); Yoshihide Komatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/242,962

(22) Filed: Sep. 23, 2011

(65) Prior Publication Data

US 2012/0008713 A1 Jan. 12, 2012

Related U.S. Application Data

(63) Continuation of application No. PCT/JP2009/005458, filed on Oct. 19, 2009.

(30) Foreign Application Priority Data

May 13, 2009 (JP) ................................. 2009-116281

(51) Int. Cl.
*H04L 27/00* (2006.01)
*H03D 3/24* (2006.01)

(52) U.S. Cl. ...................................... 375/295; 375/376

(58) Field of Classification Search .............. 375/295, 375/376; 327/144, 147, 156; 332/127
See application file for complete search history.

(56) References Cited

U.S. PATENT DOCUMENTS

| | | | |
|---|---|---|---|
| 6,340,910 B1 | 1/2002 | Saeki | |
| 6,414,528 B1* | 7/2002 | Usui | 327/158 |
| 7,006,021 B1* | 2/2006 | Lombaard | 341/100 |
| 7,228,116 B2 | 6/2007 | Cheng et al. | |
| 2001/0010475 A1 | 8/2001 | Miura et al. | |
| 2005/0088428 A1 | 4/2005 | Liu et al. | |
| 2005/0088429 A1 | 4/2005 | Cheng et al. | |
| 2005/0088430 A1 | 4/2005 | Cheng et al. | |
| 2005/0088431 A1 | 4/2005 | Liu et al. | |
| 2005/0090215 A1 | 4/2005 | Cheng et al. | |
| 2009/0195272 A1* | 8/2009 | Okuzono | 327/141 |
| 2010/0149137 A1* | 6/2010 | Saito | 345/204 |

FOREIGN PATENT DOCUMENTS

| | | |
|---|---|---|
| JP | 2001-007686 | 1/2001 |
| JP | 2001-209454 | 8/2001 |
| JP | 2007-509522 | 4/2007 |

* cited by examiner

*Primary Examiner* — Don N Vo

(74) *Attorney, Agent, or Firm* — McDermott Will & Emery LLP

(57) ABSTRACT

A data transmitter having a parallel-to-serial conversion function is supplied with a clock by a PLL circuit unit. In the PLL circuit unit, a first multiphase clock supplied to a first parallel-to-serial conversion circuit is generated and output by a multiphase VCO circuit, while a second multiphase clock supplied to a second parallel-to-serial conversion circuit is generated and output by a multiphase clock generator. The multiphase clock generator generates the second multiphase clock based on the clock output from the multiphase VCO circuit.

9 Claims, 12 Drawing Sheets

HYBRID DATA TRANSMISSION CIRCUIT

CROSS-REFERENCE TO RELATED APPLICATION

This is a continuation of PCT International Application PCT/JP2009/005458 filed on Oct. 19, 2009, which claims priority to Japanese Patent Application No. 2009-116281 filed on May 13, 2009. The disclosures of these applications including the specifications, the drawings, and the claims are hereby incorporated by reference in its entirety.

BACKGROUND

The present disclosure relates to hybrid data transmission circuits which support a plurality of interface standards utilizing different ratios of parallel-to-serial conversion.

Low voltage differential signaling (LVDS) is used as an interface for data transmission between image processing LSIs or between an image processing LSI and a display driver in a digital television set. There are a plurality of standards for LVDS, such as one compliant to IEEE 1596.3-1996 Standard for LVDS for Scalable Coherent Interface (SCI) (hereinafter referred to as "std-LVDS"), mini-LVDS, etc. In order to increase flexibility in development of chipsets, there has been an increasing need for a so-called hybrid LVDS circuit, which supports a plurality of LVDS standards in a single LSI.

The conversion ratio of parallel-to-serial conversion and the working frequency depend on the LVDS standards. For example, the std-LVDS standard utilizes parallel-to-serial conversion of 7:1, serial data transmission at 945 Mbps, and transmission of a 135 MHz clock. Meanwhile, the mini-LVDS standard utilizes parallel-to-serial conversion of 4:1, serial data transmission at 480 Mbps, and transmission of a 240 MHz clock.

Examples of the architecture of an LVDS circuit include a single-clock architecture in which parallel-to-serial conversion is performed using a high-speed single clock, and a multiphase architecture in which parallel-to-serial conversion is performed using low-speed multiphase clocks. The single-clock architecture needs a voltage-controlled oscillator (VCO) to operate at a high-speed, and thus has a problem in that the power consumption is high. Moreover, since a parallel-to-serial conversion circuit also needs to operate at a high speed, an increase in speed is difficult to achieve. Meanwhile, the multiphase architecture allows the parallel-to-serial conversion to be performed using a plurality of clocks having phases different from one another, and accordingly low speed clocks can be used, thereby allowing the power consumption to be reduced. In addition, since the operation speed of a parallel-to-serial conversion circuit can be reduced, a speed increase can be easily achieved. Thus, in terms of power consumption and speed increase, the multiphase architecture is mainly used.

However, when such multiphase architecture is applied to a hybrid circuit—for example, parallel-to-serial conversion of an odd conversion ratio (7:1) and parallel-to-serial conversion of an even conversion ratio (4:1) are both provided, then both a PLL (phase-locked loop) circuit having a multiphase VCO for 7:1 conversion and a PLL circuit having a multiphase VCO for 4:1 conversion need to be provided. This causes an increase in the circuit area and the cost.

One solution to solve this issue is described in U.S. Pat. No. 7,228,116 (Patent Document 1). FIG. 13 illustrates a circuit configuration disclosed in Patent Document 1. The configuration of FIG. 13 includes a data transmission circuit 1000 having a parallel-to-serial conversion circuit 1001, a data transmission circuit 2000 having a parallel-to-serial conversion circuit 2001, and a PLL circuit 3000 for generating clocks respectively for the parallel-to-serial conversion circuits 1001 and 2001. The parallel-to-serial conversion circuits 1001 and 2001 have different conversion ratios, and thus the PLL circuit 3000 includes two VCO circuits 3002 and 3003 to support the two different ratios of parallel-to-serial conversion. This circuit configuration only needs to include two VCO circuits, and accordingly area reduction is easier to achieve as compared to when two PLL circuits are provided.

SUMMARY

However, such circuit configuration includes two VCO circuits, which are analog circuits, to support two different ratios of parallel-to-serial conversion, and thus the circuit area and the cost for a hybrid circuit are still high. In addition, supporting more standards is difficult in practice.

In view of the above problem, it is an object of the present disclosure to provide a hybrid data transmission circuit which supports a plurality of interface standards utilizing different ratios of parallel-to-serial conversion in a smaller circuit area and at a lower cost.

In one aspect of the present disclosure, a hybrid data transmission circuit includes a data transmitter having a parallel-to-serial conversion function, and a PLL circuit unit configured to supply a clock to the data transmitter, where the data transmitter includes a first parallel-to-serial conversion circuit configured to receive a first multiphase clock, and to perform parallel-to-serial conversion at a first conversion ratio, and a second parallel-to-serial conversion circuit configured to receive a second multiphase clock, and to perform parallel-to-serial conversion at a second conversion ratio, which is different from the first conversion ratio, and the PLL circuit unit includes a multiphase VCO circuit configured to generate and output the first multiphase clock, and a multiphase clock generator configured to generate and output the second multiphase clock based on the clock output from the multiphase VCO circuit.

According to the above aspect, the data transmitter having a parallel-to-serial conversion function is supplied with a clock by the PLL circuit unit. In the PLL circuit unit, the first multiphase clock supplied to the first parallel-to-serial conversion circuit is generated and output by the multiphase VCO circuit, while the second multiphase clock supplied to the second parallel-to-serial conversion circuit is generated and output by the multiphase clock generator. The multiphase clock generator generates the second multiphase clock based on the clock output from the multiphase VCO circuit. That is, a single multiphase VCO circuit can support a combination of different conversion ratios of parallel-to-serial conversion.

According to the present disclosure, a single multiphase VCO circuit can support a combination of different conversion ratios of parallel-to-serial conversion, thereby allowing a hybrid data transmission circuit to be implemented in a smaller circuit area and at a lower cost.

DETAILED DESCRIPTION

As used herein, the term "multiphase clock" may refer collectively to a group of clocks having a same frequency and different phases, or may refer individually to a clock having a particular phase.

Figure 1:
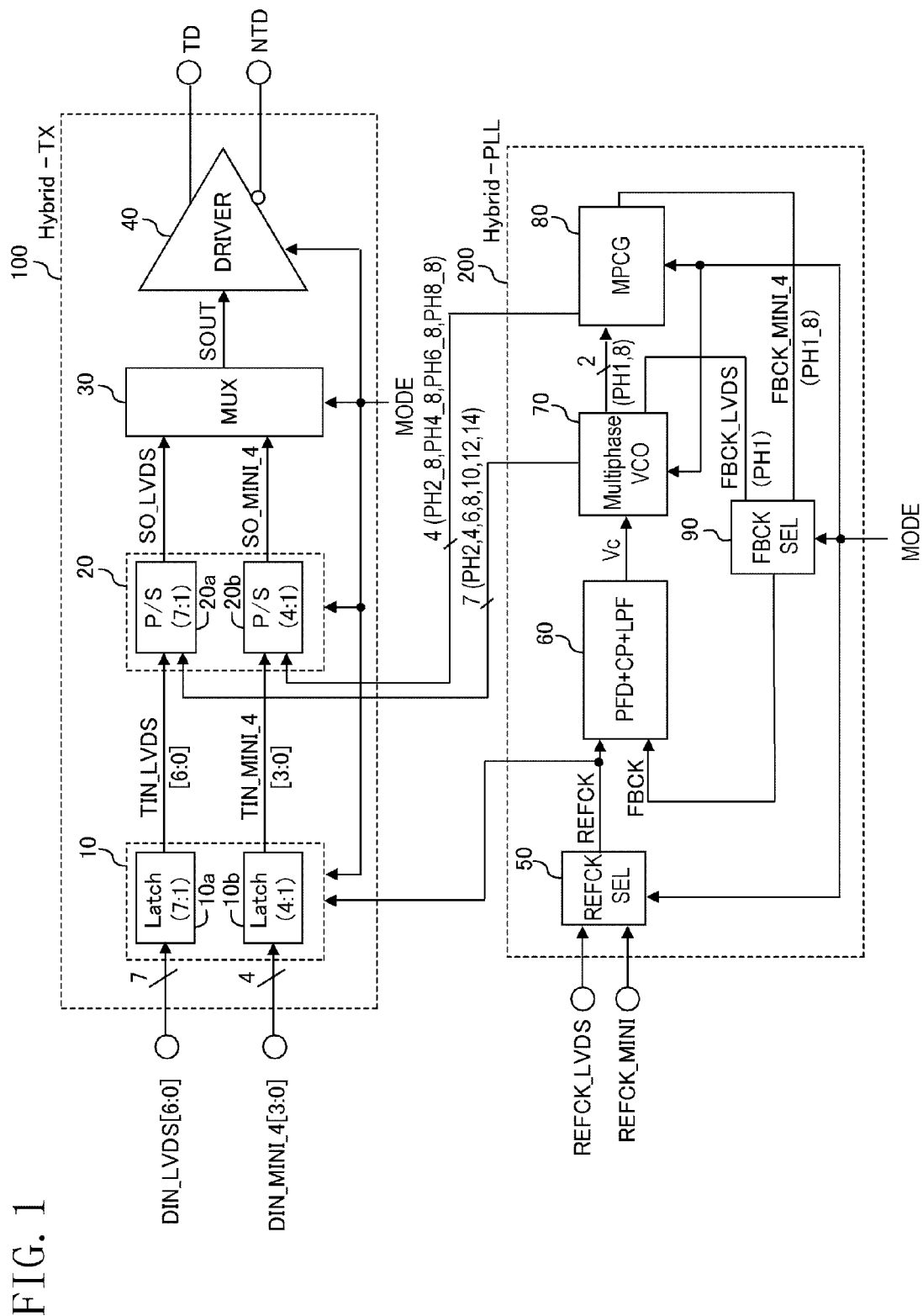
FIG. 1 is a circuit diagram illustrating a configuration of a hybrid data transmission circuit according to one example embodiment.

FIG. 1 is a circuit diagram illustrating a configuration of a hybrid data transmission circuit according to one example embodiment. The hybrid data transmission circuit of this embodiment supports the std-LVDS standard and the mini-LVDS standard as the plurality of LVDS standards. The std-LVDS standard complies with IEEE 1596.3-1996 Standard for LVDS for Scalable Coherent Interface (SCI), and utilizes parallel-to-serial conversion of 7:1 as a first conversion ratio, serial data transmission at 945 Mbps, and transmission of a 135 MHz clock. Meanwhile, the mini-LVDS standard utilizes parallel-to-serial conversion of 4:1 as a second conversion ratio, serial data transmission at 480 Mbps, and transmission of a 240 MHz clock.

The hybrid data transmission circuit shown in FIG. 1 includes a data transmitter (Hybrid-TX) 100 having a parallel-to-serial conversion function, and a PLL circuit unit (Hybrid-PLL) 200, which supplies a clock to the data transmitter 100. The hybrid data transmission circuit further includes terminals for respectively receiving seven-bit parallel data DIN_LVDS[6:0] for std-LVDS, four-bit parallel data DIN_MINI_4[3:0] for mini-LVDS, a reference clock REFCK_LVDS for std-LVDS, and a reference clock REFCK_MINI for mini-LVDS as input terminals, and terminals for outputting differential data TD/NTD as output terminals.

The hybrid data transmission circuit shown in FIG. 1 is configured to be switchable between a std-LVDS mode as a first mode and a mini-LVDS mode as a second mode by means of a mode switch signal MODE. When the mode switch signal MODE is at a low level (MODE=L), the hybrid data transmission circuit is in the std-LVDS mode, parallel-to-serial conversion of 7:1 is performed on the seven-bit parallel data DIN_LVDS[6:0], and the obtained serial data is output as the serial differential data TD/NTD. Meanwhile, when the mode switch signal MODE is at a high level (MODE=H), the hybrid data transmission circuit is in the mini-LVDS mode, parallel-to-serial conversion of 4:1 is performed on the four-bit parallel data DIN_MINI_4[3:0], and the obtained serial data is output as the serial differential data TD/NTD.

The data transmitter 100 includes a latch unit 10, a parallel-to-serial converter 20, a data selector circuit 30, and a data driver circuit 40. The latch unit 10 includes a first latch circuit 10a for std-LVDS and a second latch circuit 10b for mini-LVDS. The latch circuit to be operated can be switched between the first and second latch circuits 10a and 10b by means of the mode switch signal MODE.

The parallel-to-serial converter 20 is a circuit which performs parallel-to-serial conversion using a multiphase clock, and is formed by logic circuits. A first parallel-to-serial conversion circuit 20a for std-LVDS receives a seven-phase clock as a first multiphase clock, and performs parallel-to-serial conversion of 7:1. The second parallel-to-serial conversion circuit 20b for mini-LVDS receives a four-phase clock as a second multiphase clock, and performs parallel-to-serial conversion of 4:1. The parallel-to-serial conversion circuit to be operated can be switched between the first and second parallel-to-serial conversion circuits 20a and 20b by means of the mode switch signal MODE.

The PLL circuit unit 200 includes a clock selector circuit 50, a phase comparator-charge pump-filter circuit 60, a multiphase VCO circuit 70, a multiphase clock generator 80, and a feedback clock selector circuit 90. The clock selector circuit 50 selects either the reference clock REFCK_LVDS for std-LVDS or the reference clock REFCK_MINI for mini-LVDS as a reference clock REFCK based on the mode switch signal MODE. The feedback clock selector circuit 90 selects either a feedback clock FBCK_LVDS for std-LVDS or a feedback clock FBCK_MINI_4 for mini-LVDS as a feedback clock FBCK based on the mode switch signal MODE. The phase comparator-charge pump-filter circuit 60 provides feedback adjustment so that the frequency and the phase of the reference clock REFCK match the frequency and the phase of the feedback clock FBCK. The reference clock REFCK is also supplied to the latch unit 10 of the data transmitter 100.

The multiphase VCO circuit 70 generates and outputs the seven-phase clock. The seven-phase clock is supplied to the first parallel-to-serial conversion circuit 20a in the parallel-to-serial converter 20 of the data transmitter 100. The multiphase clock generator 80 generates and outputs the four-phase clock based on the clock output from the multiphase VCO circuit 70. The four-phase clock is supplied to the second parallel-to-serial conversion circuit 20b in the parallel-to-serial converter 20 of the data transmitter 100.

In the std-LVDS mode (when MODE=L), REFCK_LVDS is selected as the reference clock REFCK, FBCK_LVDS is selected as the feedback clock FBCK, and the multiphase VCO circuit 70 supplies the first parallel-to-serial conversion circuit 20a with the seven-phase clock. Meanwhile, in the mini-LVDS mode (when MODE=H), REFCK_MINI is selected as the reference clock REFCK, FBCK_MINI_4 is selected as the feedback clock FBCK, and the multiphase clock generator 80 supplies the second parallel-to-serial conversion circuit 20b with the four-phase clock.

Next, the multiphase VCO circuit 70 and the multiphase clock generator 80 will be described in detail.

Figure 2:
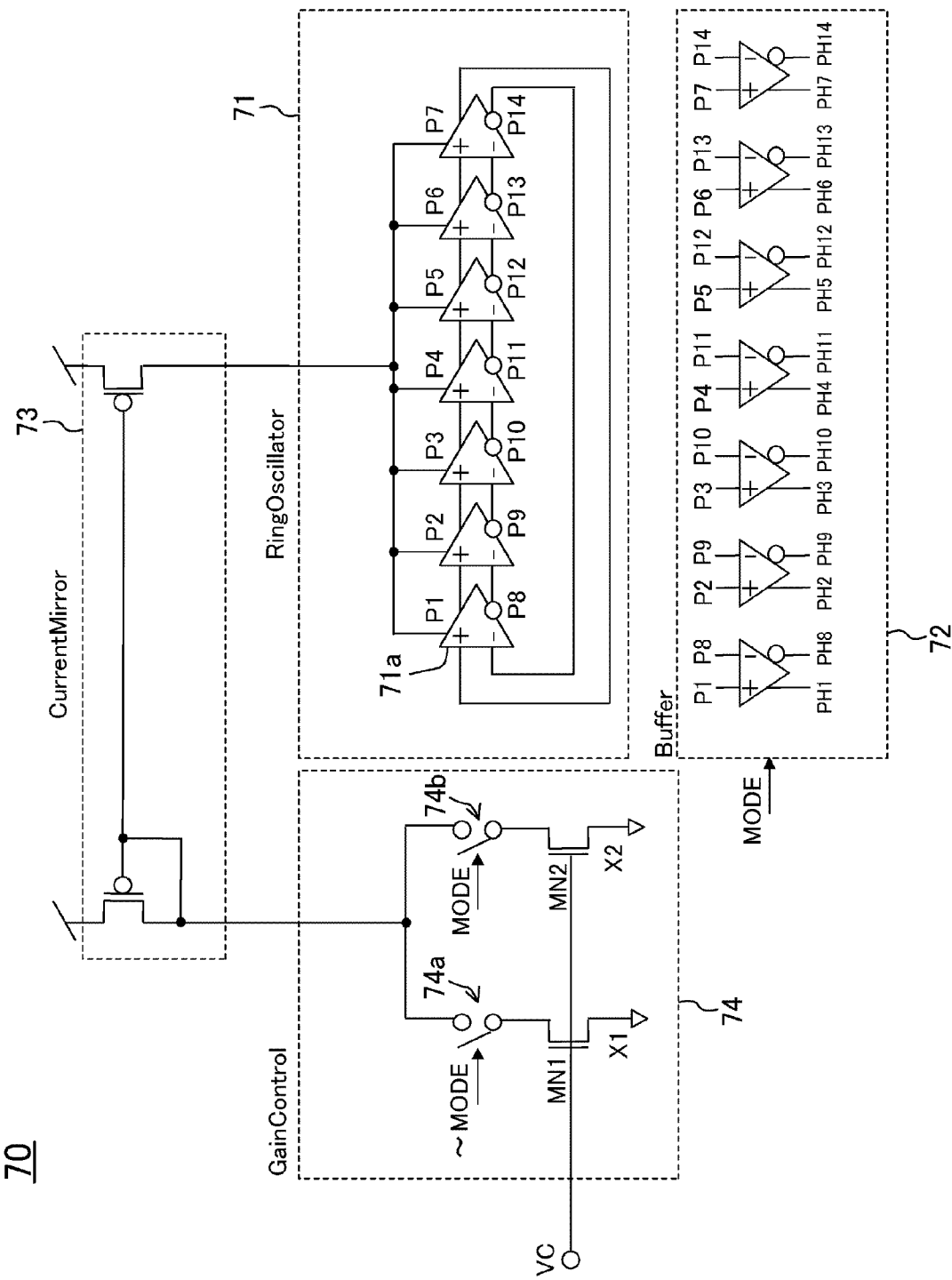
FIG. 2 illustrates an example configuration of the multiphase VCO circuit in the configuration of FIG. 1.

FIG. 2 illustrates an example configuration of the multiphase VCO circuit 70. In the configuration of FIG. 2, the multiphase VCO circuit 70 includes a ring oscillator 71, an output buffer unit 72, a current mirror unit 73, and a gain controller 74. The ring oscillator 71 is a differential ring oscillator having seven stages of differential delay elements 71a coupled in the form of a ring. This differential ring oscillator generates fourteen-phase multiphase clocks P1-P14 having a same frequency and an equal phase difference therebetween. The output buffer unit 72 makes each of the amplitudes of the multiphase clocks P1-P14 at full-swing state up to the supply voltage, and outputs the resultant clocks as multiphase clocks PH1-PH14. Then, the clocks PH2, PH4, PH6, PH8, PH10, PH12, and PH14 are supplied to the first parallel-to-serial conversion circuit 20*a* as the seven-phase multiphase clock.

The oscillation frequency of the ring oscillator 71 changes depending on the current supplied from the current mirror unit 73. Here, the current mirror unit 73 is formed by p-channel transistors, and mirrors the current determined in the gain controller 74, and then supplies the obtained current to the ring oscillator 71. That is, changing the current value in the gain controller 74 allows the oscillation frequency of the ring oscillator 71 to be changed.

The gain controller 74 includes n-channel transistors MN1 and MN2 having different sizes from each other, and switches 74*a* and 74*b*, which are turned on and off by means of the mode switch signal MODE. Here, it is assumed that the size of the transistor MN2 is twice that of the transistor MN1. The gates of the n-channel transistors MN1 and MN2 are supplied with an output VC of the phase comparator-charge pump-filter circuit 60. The setting of the mode switch signal MODE allows the transistor coupled to the current mirror unit 73 to be switched. Thus, the amount of current supplied to the ring oscillator 71 changes, thereby causing the oscillation frequency of the ring oscillator 71 to be changed. That is, the multiphase VCO circuit 70 of FIG. 2 is configured such that the oscillation frequency can be switched depending on the mode switch signal MODE. Thus, a plurality of standards utilizing working frequencies significantly different from one another can be supported by providing only a single ring oscillator in the VCO circuit, thereby allowing the circuit area to be reduced.

In this embodiment, the oscillation frequency needs to be higher in the mini-LVDS mode. Accordingly, in the std-LVDS mode (when MODE=L), the switch 74*a* is turned on to select the transistor MN1, and thus the VCO gain is set to a lower value, while in the mini-LVDS mode (when MODE=H), the switch 74*b* is turned on to select the transistor MN2, and thus the VCO gain is set to a higher value.

Although the configuration of FIG. 2 assumes that the gain controller 74 is formed by n-channel transistors, and that the current mirror unit 73 is formed by p-channel transistors, the configuration is not limited thereto. For example, the gain controller 74 may be formed by p-channel transistors, and the current mirror unit 73 may be formed by n-channel transistors. Alternatively, the gain controller 74 may be formed by p-channel transistors, and the current mirror unit 73 may be formed by a combination of an n-channel transistor and a p-channel transistor.

Figure 3:
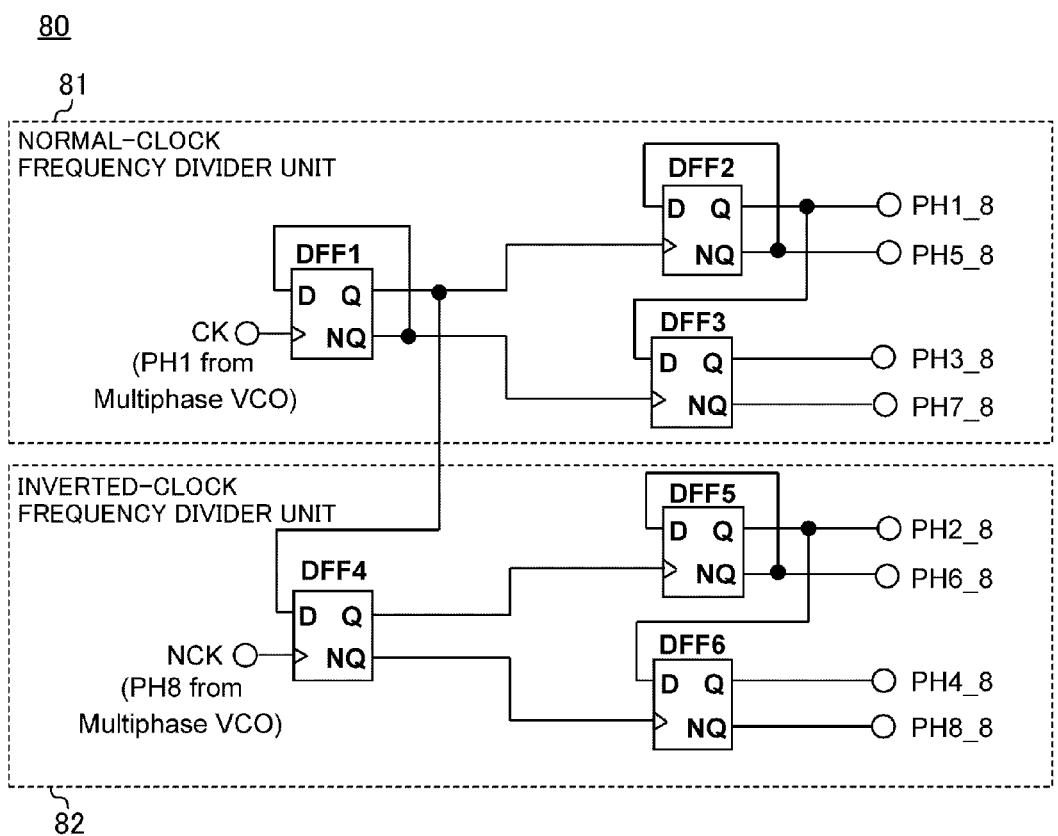
FIG. 3 illustrates an example configuration of the multiphase clock generator in the configuration of FIG. 1.

FIG. 3 illustrates an example configuration of the multiphase clock generator 80. The multiphase clock generator 80 shown in FIG. 3 receives the clocks PH1 and PH8 output from the multiphase VCO circuit 70 of FIG. 2 as complementary normal and inverted clocks CK and NCK. In the configuration of FIG. 3, the multiphase clock generator 80 includes a normal-clock frequency divider unit 81 and an inverted-clock frequency divider unit 82. The normal-clock frequency divider unit 81 includes a plurality of flip-flops DFF1, DFF2, and DFF3, and divides the frequency of the normal clock CK (PH1) by four. The inverted-clock frequency divider unit 82 includes a plurality of flip-flops DFF4, DFF5, and DFF6, and divides the frequency of the inverted clock NCK (PH8) by four. This configuration generates eight-phase multiphase clocks PH1_8, PH2_8, PH3_8, PH4_8, PH5_8, PH6_8, PH7_8, and PH8_8.

However, only dividing each of the frequencies of the normal and the inverted clocks CK and NCK by four is not sufficient to allow the timings of the starts of frequency dividing to have a proper relationship, and thus cannot necessarily generate the eight-phase multiphase clock correctly. Thus, to solve this problem, a data output terminal Q of the flip-flop DFF1 which receives the normal clock CK in the normal-clock frequency divider unit 81 and the data input terminal D of the flip-flop DFF4 which receives the inverted clock NCK in the inverted-clock frequency divider unit 82 are coupled together in the configuration of FIG. 3. Thus, the inverted-clock frequency divider unit 82 starts frequency dividing after the normal-clock frequency divider unit 81 has started frequency dividing, and thus the timings of the starts of frequency dividing have a proper relationship, thereby allowing a multiphase clock having phases with an equal phase difference to be correctly generated.

Although it is assumed here that the multiphase clock generator 80 receives the complementary normal and inverted clocks output from the multiphase VCO circuit 70, the configuration is not limited thereto, but a configuration such that the multiphase clock generator 80 receives other clocks can be implemented.

Figure 4:
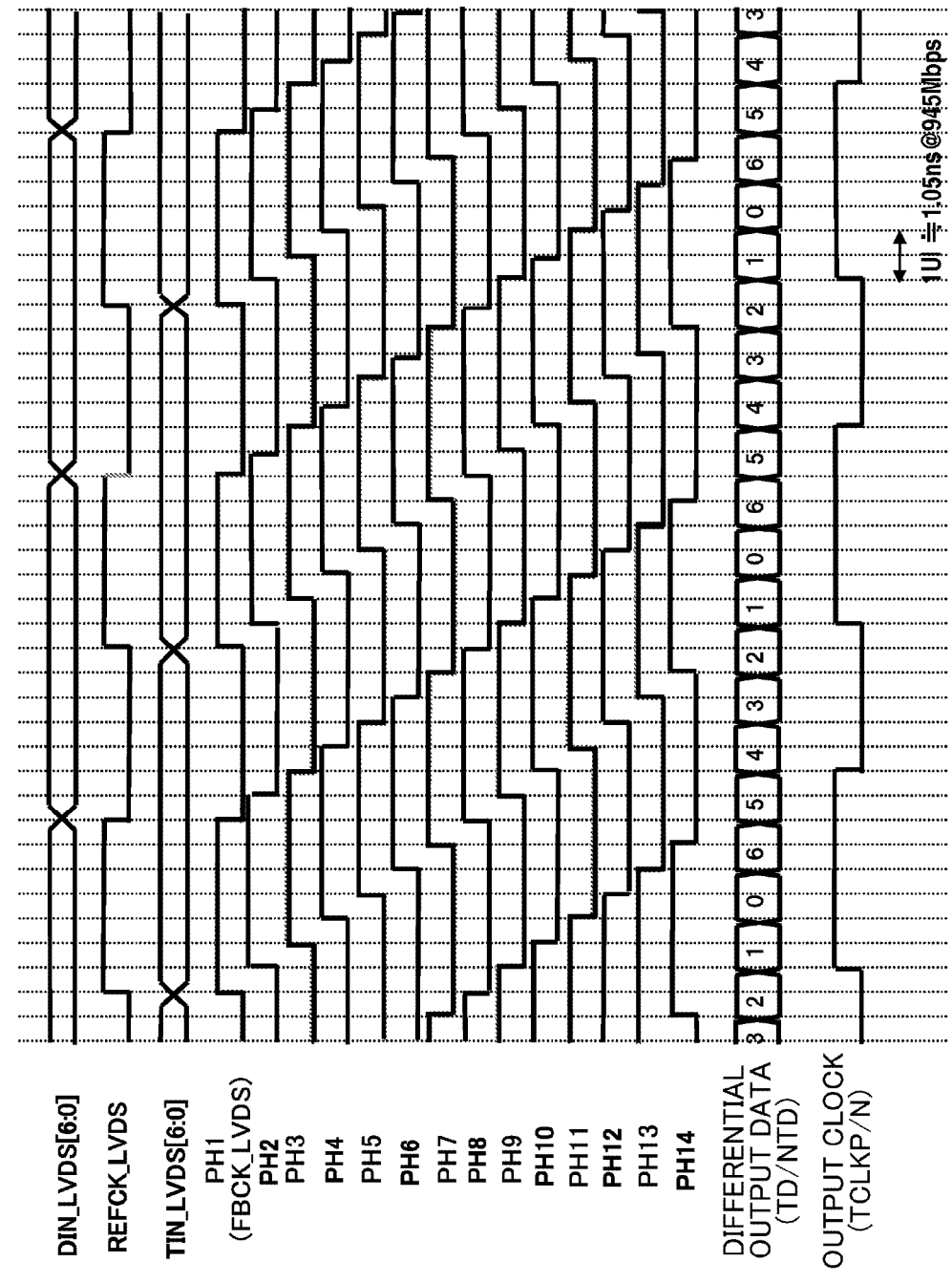
FIG. 4 is a timing diagram illustrating an operation in the std-LVDS mode.

FIG. 4 is a timing diagram illustrating an operation in the std-LVDS (7:1) mode. In the std-LVDS mode, the first latch circuit 10*a* and the first parallel-to-serial conversion circuit 20*a* operate in the data transmitter 100. In the PLL circuit unit 200, the clock selector circuit 50 selects the reference clock REFCK_LVDS for std-LVDS as the reference clock REFCK, and the feedback clock selector circuit 90 selects the feedback clock FBCK_LVDS for std-LVDS as the feedback clock FBCK.

Each bit of the input seven-bit parallel data DIN_LVDS[6:0] is transmitted at 135 Mbps. The frequency of the input reference clock REFCK_LVDS is 135 MHz. The parallel data DIN_LVDS[6:0] is input from an external digital circuit in synchronism with a falling edge of the reference clock REFCK_LVDS. The first latch circuit 10*a* latches the data DIN_LVDS[6:0] with the timing of the reference clock REFCK (≈REFCK_LVDS), and generates latched data TIN_LVDS[6:0]. The latched data TIN_LVDS[6:0] is input to the first parallel-to-serial conversion circuit 20*a* in synchronism with a rising edge of the reference clock REFCK.

The fourteen-phase multiphase clocks PH1-PH14 generated by the multiphase VCO circuit 70 each have a frequency of 135 MHz, and the rising edges thereof are sequentially shifted by 525 $p_s$ (=period/14). The clock PH1 is used as the feedback clock FBCK_LVDS. The feedback mechanism of the PLL matches the phase of the clock PH1 with the phase of the reference clock REFCK_LVDS (i.e., the phase of the latched data TIN_LVDS[6:0]).

Under this condition of matched phases, the first parallel-to-serial conversion circuit 20*a* performs conversion using the seven-phase clocks PH2, PH4, PH6, PH8, PH10, PH12, and PH14 starting with the clock PH2 having a phase shift of 525 ps relative to the clock PH1. That is, the latched data TIN_LVDS[6:0] is sequentially extracted based on the seven-phase clocks PH2, PH4, PH6, PH8, PH10, PH12, and PH14. The interval between edges of the seven-phase clocks is 1.05 ns, which corresponds to the minimum interval of serial data of 945 Mbps. The data generated by the parallel-to-serial conversion is output to an external cable, to an external board line, etc., as the differential output data TD/NTD.

Figure 5:
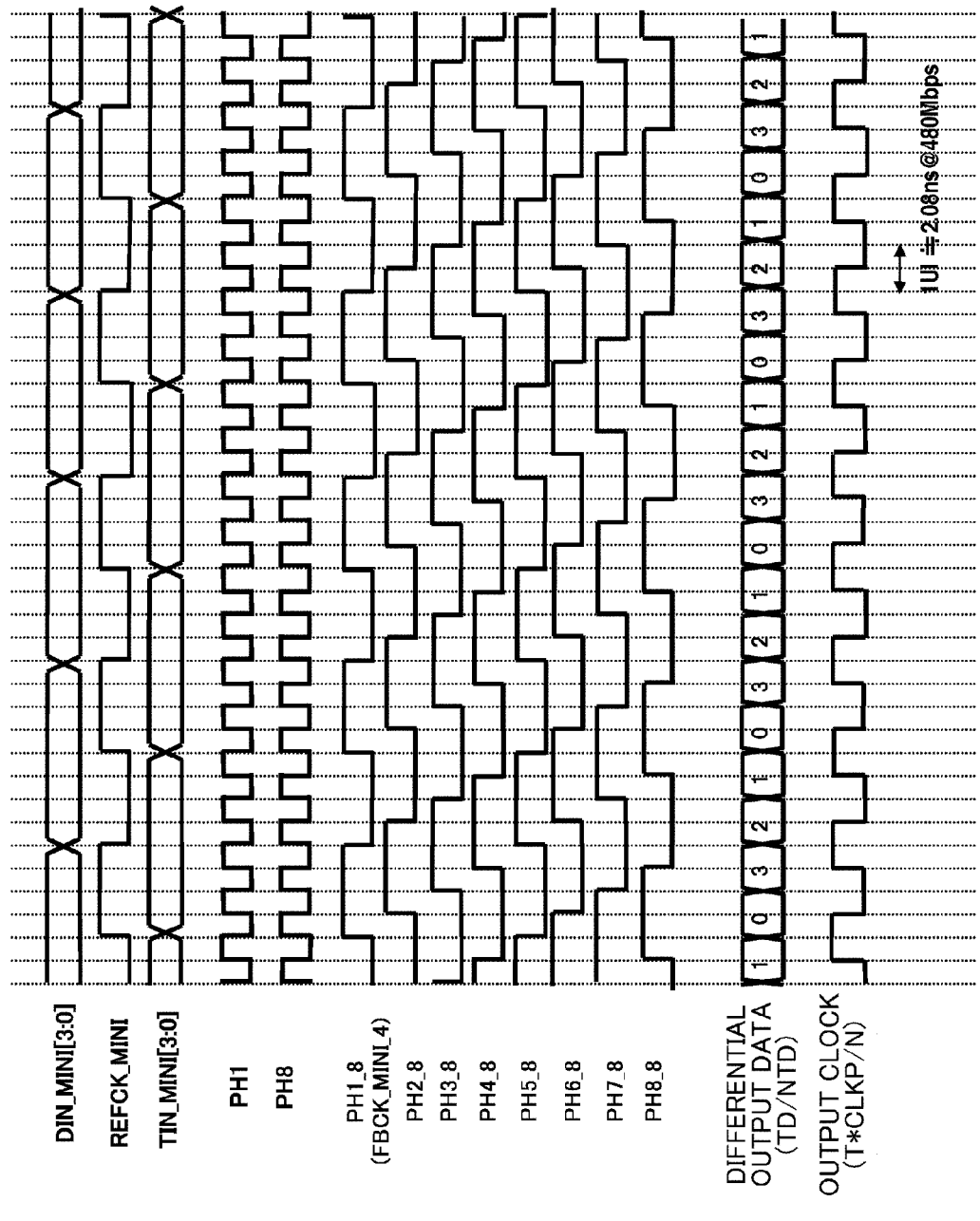
FIG. 5 is a timing diagram illustrating an operation in the mini-LVDS mode.

FIG. 5 is a timing diagram illustrating an operation in the mini-LVDS (4:1) mode. In the mini-LVDS mode, the second latch circuit 10*b* and the second parallel-to-serial conversion circuit 20*b* operate in the data transmitter 100. In the PLL circuit unit 200, the clock selector circuit 50 selects the reference clock REFCK_MINI for mini-LVDS as the reference clock REFCK, and the feedback clock selector circuit 90 selects the feedback clock FBCK_MINI_4 for mini-LVDS as the feedback clock FBCK.

Each bit of the input four-bit parallel data DIN_MINI[3:0] is transmitted at 120 Mbps. The frequency of the input reference clock REFCK_MINI is 120 MHz. The parallel data DIN_MINI[3:0] is input from an external digital circuit in synchronism with a falling edge of the reference clock REFCK_MINI. The second latch circuit 10b latches the data DIN_MINI[3:0] with the timing of the reference clock REFCK (≈REFCK_MINI), and generates latched data TIN_MINI[3:0]. The latched data TIN_MINI[3:0] is input to the second parallel-to-serial conversion circuit 20b in synchronism with a rising edge of the reference clock REFCK.

The eight-phase multiphase clocks PH1_8-PH8_8 generated by the multiphase clock generator 80 are generated based on the differential clocks PH1 and PH8 (having a frequency of 480 MHz) output from the multiphase VCO circuit 70. The multiphase clocks PH1_8-PH8_8 each have a frequency of 120 MHz (=480/4), and the rising edges thereof are sequentially shifted by 1.04 ns (=period/8). The clock PH1_8 is used as the feedback clock FBCK_MINI_4. The feedback mechanism of the PLL matches the phase of the clock PH1_8 with the phase of the reference clock REFCK_MINI (i.e., the phase of the latched data TIN_MINI[3:0]).

Under this condition of matched phases, the second parallel-to-serial conversion circuit 20b performs conversion using the four-phase clocks PH2_8, PH4_8, PH6_8, and PH8_8 starting with the clock PH2_8 having a phase shift of 1.04 ns relative to the clock PH1_8. That is, the latched data TIN_MINI[3:0] is sequentially extracted based on the four-phase clocks PH2_8, PH4_8, PH6_8, and PH8_8. The interval between edges of the four-phase clocks is 2.08 ns, which corresponds to the minimum interval of serial data of 480 Mbps. The data generated by the parallel-to-serial conversion is output to an external cable, to an external board line, etc., as the differential output data TD/NTD.

As described above, according to this embodiment, a single multiphase VCO circuit can support a plurality of interface standards utilizing different conversion ratios of parallel-to-serial conversion. In addition, even when parallel-to-serial conversion of both an odd ratio (7:1) and an even ratio (4:1) is required, provision of a multiphase clock generator having a simple configuration can support this situation. Thus, a hybrid data transmission circuit which can flexibly support various combinations of ratios of parallel-to-serial conversion can be implemented in a small circuit area and at a low cost.

In addition, it is preferable that the PLL circuit unit 200 skip processing of unused multiphase clocks by fixing such clocks at L (Low-level) or H (High-level) in each mode. Thus, the power consumption is reduced. That is, in the std-LVDS mode, the multiphase clock generator 80 fixes the output four-phase clocks at L or H. More specifically, for example, it is preferable that a reset signal be provided for each of the flip-flops DFF1-DFF6. Meanwhile, in the mini-LVDS mode, the multiphase VCO circuit 70 fixes the output eight-phase clocks at L or H. More specifically, for example, it is preferable that the supply of power to the output buffer unit 72 be stopped. In this case, however, the supply of power to the buffer which outputs the clocks PH1 and PH8 should not be stopped because the multiphase clock generator 80 in the next stage needs the clocks PH1 and PH8.

Figure 6:
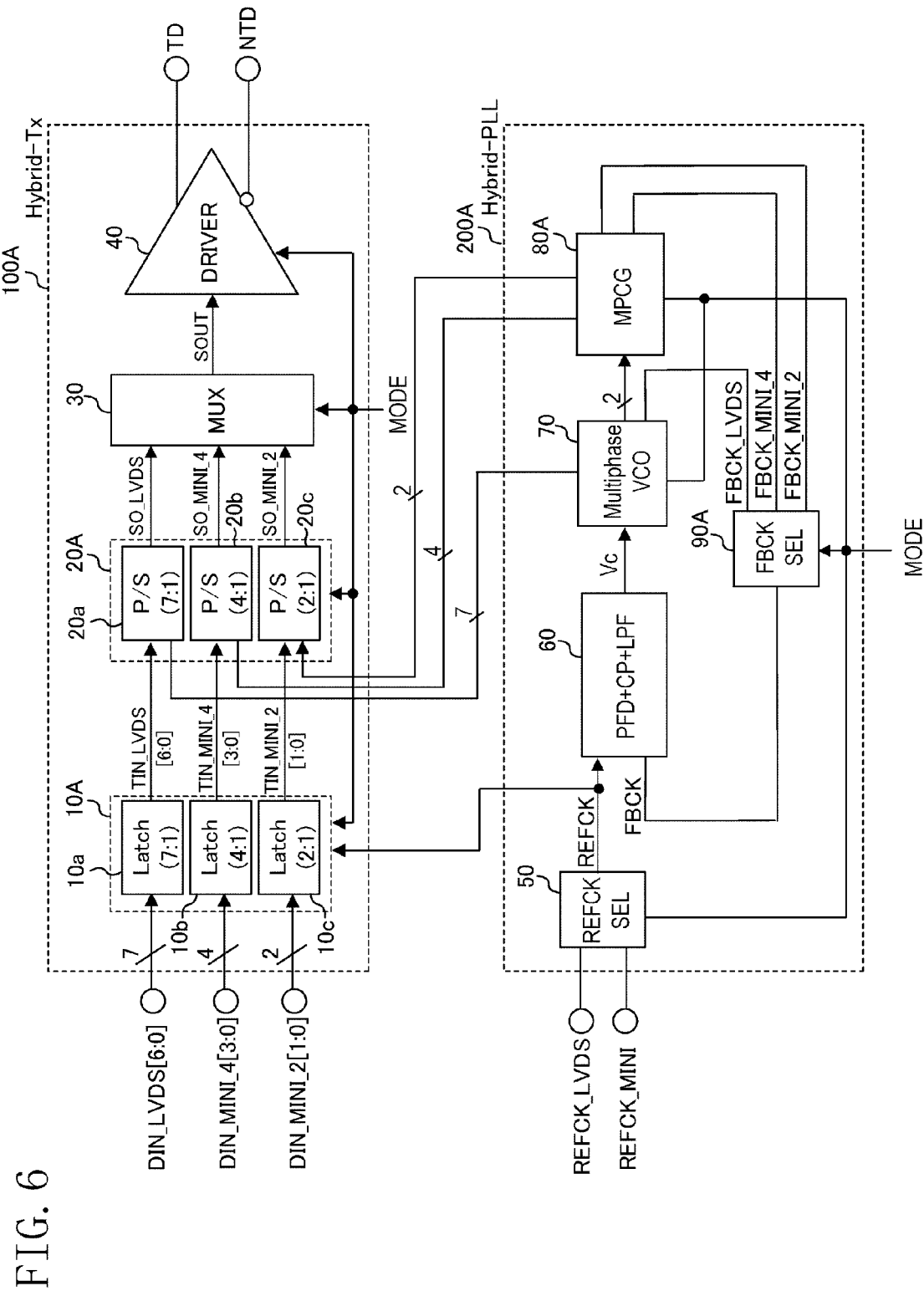
FIG. 6 is a circuit diagram illustrating a configuration of a hybrid data transmission circuit according to a variant.

FIG. 6 is a circuit diagram illustrating a configuration of a hybrid data transmission circuit according to a variant. The hybrid data transmission circuit according to this variant supports the std-LVDS standard and two types of mini-LVDS standard as the plurality of LVDS standards. That is, the mini-LVDS standard utilizes parallel-to-serial conversion of 2:1 as a third conversion ratio, in addition to the parallel-to-serial conversion of 4:1.

The hybrid data transmission circuit shown in FIG. 6 includes a data transmitter (Hybrid-TX) 100A having a parallel-to-serial conversion function, and a PLL circuit unit (Hybrid-PLL) 200A, which supplies a clock to the data transmitter 100A. The hybrid data transmission circuit further includes terminals for respectively receiving seven-bit parallel data DIN_LVDS[6:0] for std-LVDS, four-bit parallel data DIN_MINI_4[3:0] for mini-LVDS, two-bit parallel data DIN_MINI_2[1:0] for mini-LVDS, a reference clock REFCK_LVDS for std-LVDS, and a reference clock REFCK_MINI for mini-LVDS as input terminals, and terminals for outputting differential data TD/NTD as output terminals. Note that in FIG. 6, the same reference characters as those shown in FIG. 1 are used to represent elements common to FIGS. 1 and 6, and the detailed explanation thereof will be omitted.

In the data transmitter 100A, a latch unit 10A includes a third latch circuit 10c for mini-LVDS (2:1) in addition to the first latch circuit 10a for std-LVDS and the second latch circuit 10b for mini-LVDS (4:1). The latch circuit to be operated can be switched among the first, second, and third latch circuits 10a, 10b, and 10c by means of the mode switch signal MODE. The parallel-to-serial converter 20A includes a third parallel-to-serial conversion circuit 20c for mini-LVDS (2:1), which receives a two-phase clock as a third multiphase clock, and performs parallel-to-serial conversion of 2:1, in addition to the first parallel-to-serial conversion circuit 20a for std-LVDS and the second parallel-to-serial conversion circuit 20b for mini-LVDS (4:1). The parallel-to-serial conversion circuit to be operated can be switched among the first, second, and third parallel-to-serial conversion circuits 20a, 20b, and 20c by means of the mode switch signal MODE.

In the PLL circuit unit 200A, a feedback clock selector circuit 90A selects one of a feedback clock FBCK_LVDS for std-LVDS, a feedback clock FBCK_MINI_4 for mini-LVDS (4:1), or a feedback clock FBCK_MINI_2 for mini-LVDS (2:1) as a feedback clock FBCK based on the mode switch signal MODE. A multiphase clock generator 80A generates and outputs the four-phase clock and the two-phase clock based on the clock output from the multiphase VCO circuit 70. The four-phase clock and the two-phase clock are respectively supplied to the second and the third parallel-to-serial conversion circuits 20b and 20c in the parallel-to-serial converter 20A of the data transmitter 100A.

Figure 7:
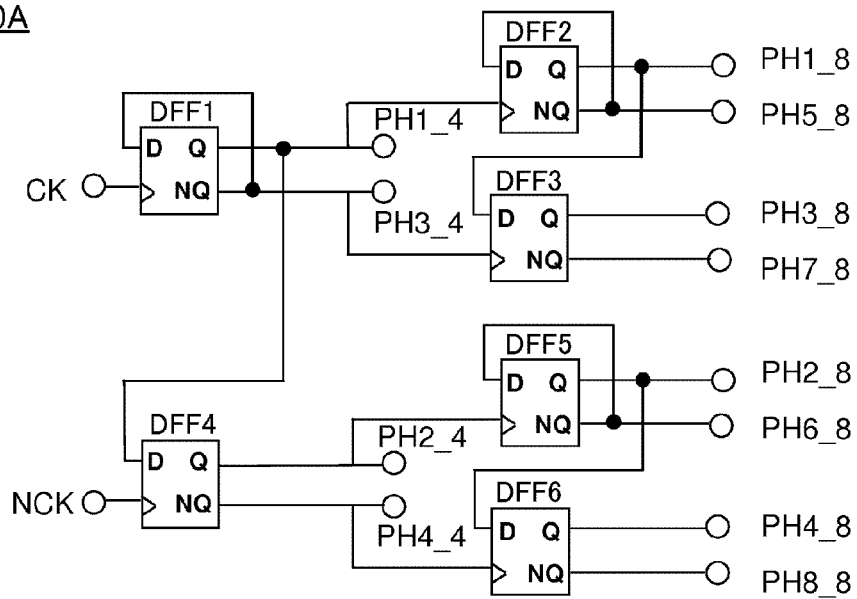
FIG. 7 illustrates an example configuration of the multiphase clock generator in the configuration of FIG. 6.

FIG. 7 illustrates an example configuration of the multiphase clock generator 80A. The configuration of FIG. 7 is basically the same as that of the multiphase clock generator 80 of FIG. 3, except that the normal and the inverted outputs of the flip-flops DFF1 and DFF4 are four-phase multiphase clocks PH1_4, PH2_4, PH3_4, and PH4_4. Among these clocks, for example, the clocks PH2_4 and PH4_4 are supplied to the third parallel-to-serial conversion circuit 20c as the two-phase clock.

Thus, according to this variation, a single multiphase VCO circuit can support three interface standards requiring parallel-to-serial conversion of 7:1, 4:1, and 2:1 by providing a multiphase clock generator having a simple configuration similarly to the above embodiment.

A configuration similar to those of the multiphase clock generators shown in FIGS. 3 and 7 can generate and output a multiphase clock having as many phases as a power of two, such as a two-phase, four-phase, eight-phase, or sixteen-phase multiphase clock. Accordingly, a hybrid data transmission circuit can be implemented for a combination of parallel-to-serial conversion of K:1 (where K is an integer greater than or equal to 2) and parallel-to-serial conversion of one or more ratios of a power of two:1 in a similar manner to the embodiment and the variation described above.

Moreover, a multiphase clock generator which can generate a clock having as many phases as a number which is not a power of two can be implemented by a simple circuit configuration using flip-flops.

Figure 8:
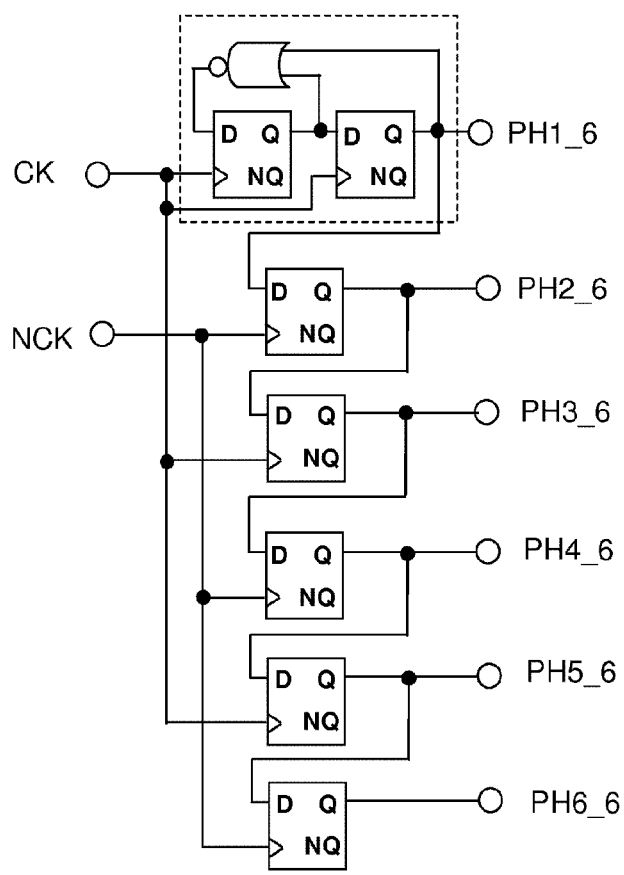
FIG. 8 illustrates an example configuration of a multiphase clock generator capable of generating a six-phase clock.
Figure 9:
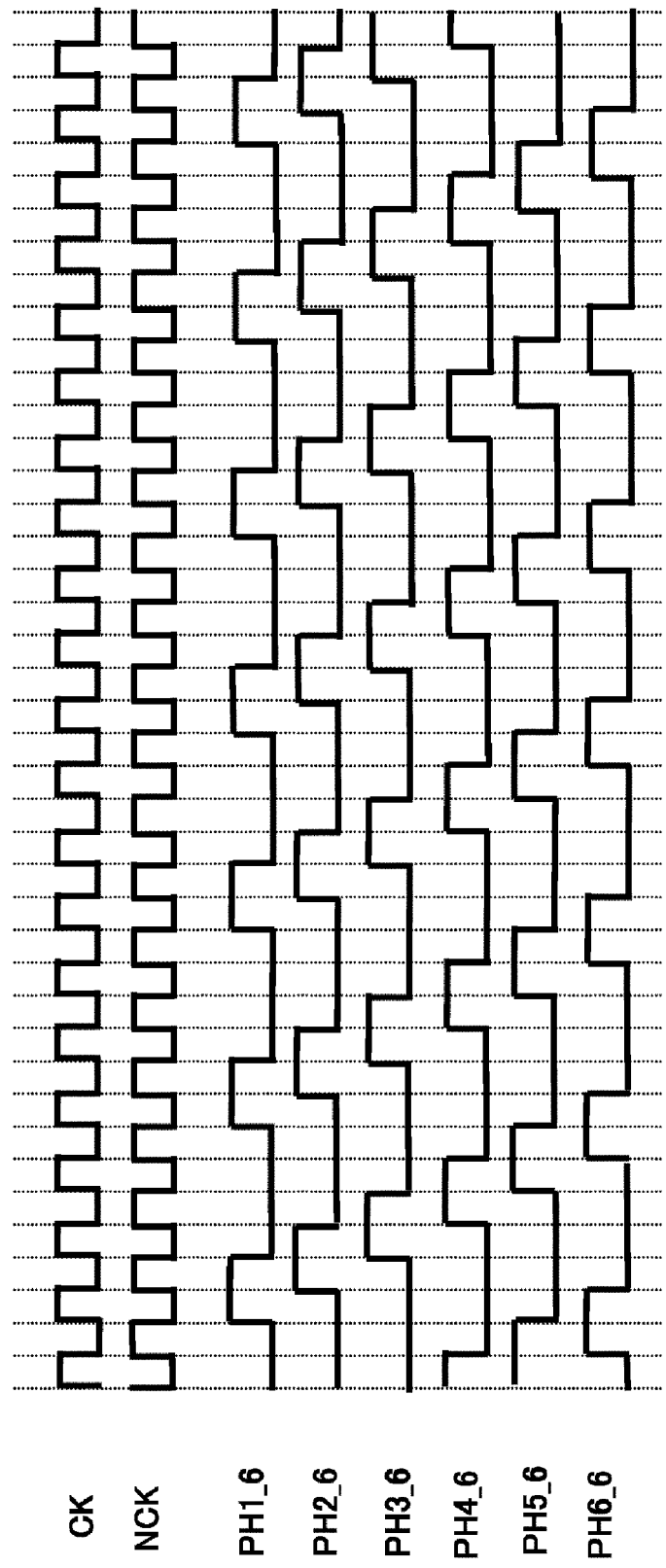
FIG. 9 is a timing diagram illustrating the six-phase clock generated in the configuration of FIG. 8.

For example, FIG. 8 illustrates an example configuration of a multiphase clock generator capable of generating a six-phase clock, and FIG. 9 is a timing diagram illustrating the generated six-phase clocks PH1_6-PH6_6. Furthermore, for example, the clocks PH2_6, PH4_6, and PH6_6 can also be output as a three-phase clock.

Figure 10:
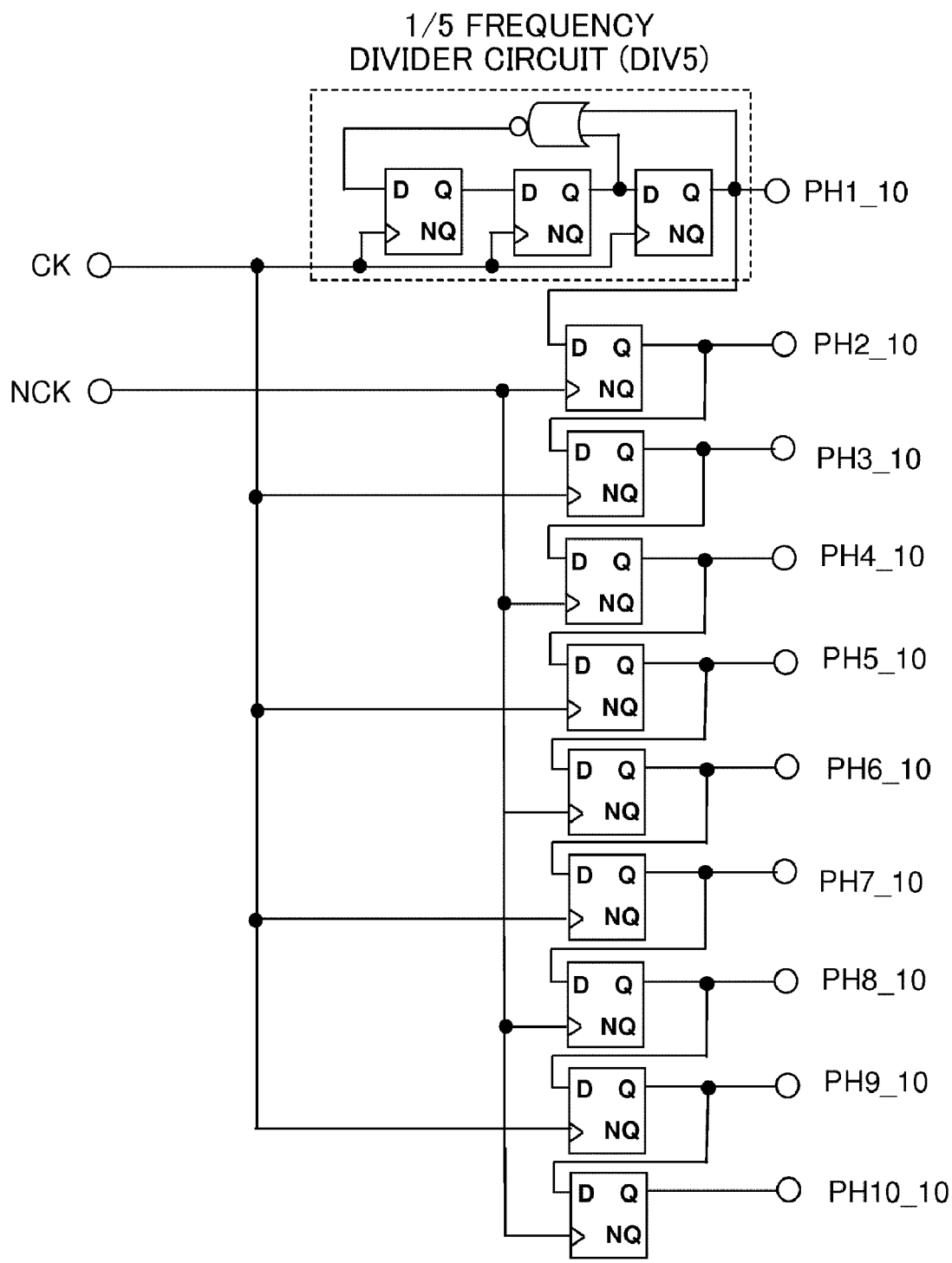
FIG. 10 illustrates an example configuration of a multiphase clock generator capable of generating a ten-phase clock.
Figure 11:
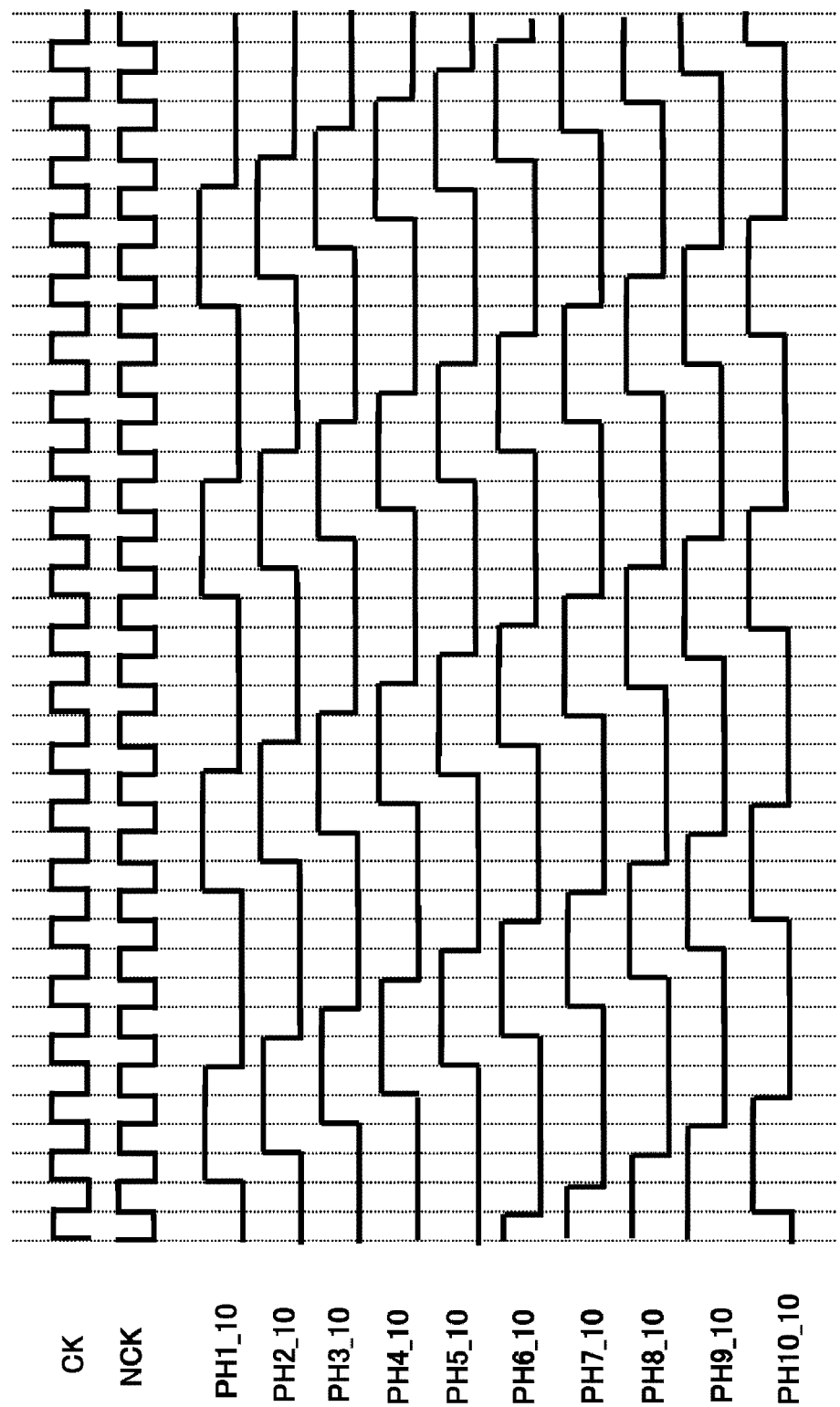
FIG. 11 is a timing diagram illustrating the ten-phase clock generated in the configuration of FIG. 10.

FIG. 10 illustrates an example configuration of a multiphase clock generator capable of generating a ten-phase clock, and FIG. 11 is a timing diagram illustrating the generated ten-phase clocks PH1_10-PH10_10. Furthermore, for example, the clocks PH2_10, PH4_10, PH6_10, PH8_10, and PH10_10 can also be output as a five-phase clock.

Figure 12:
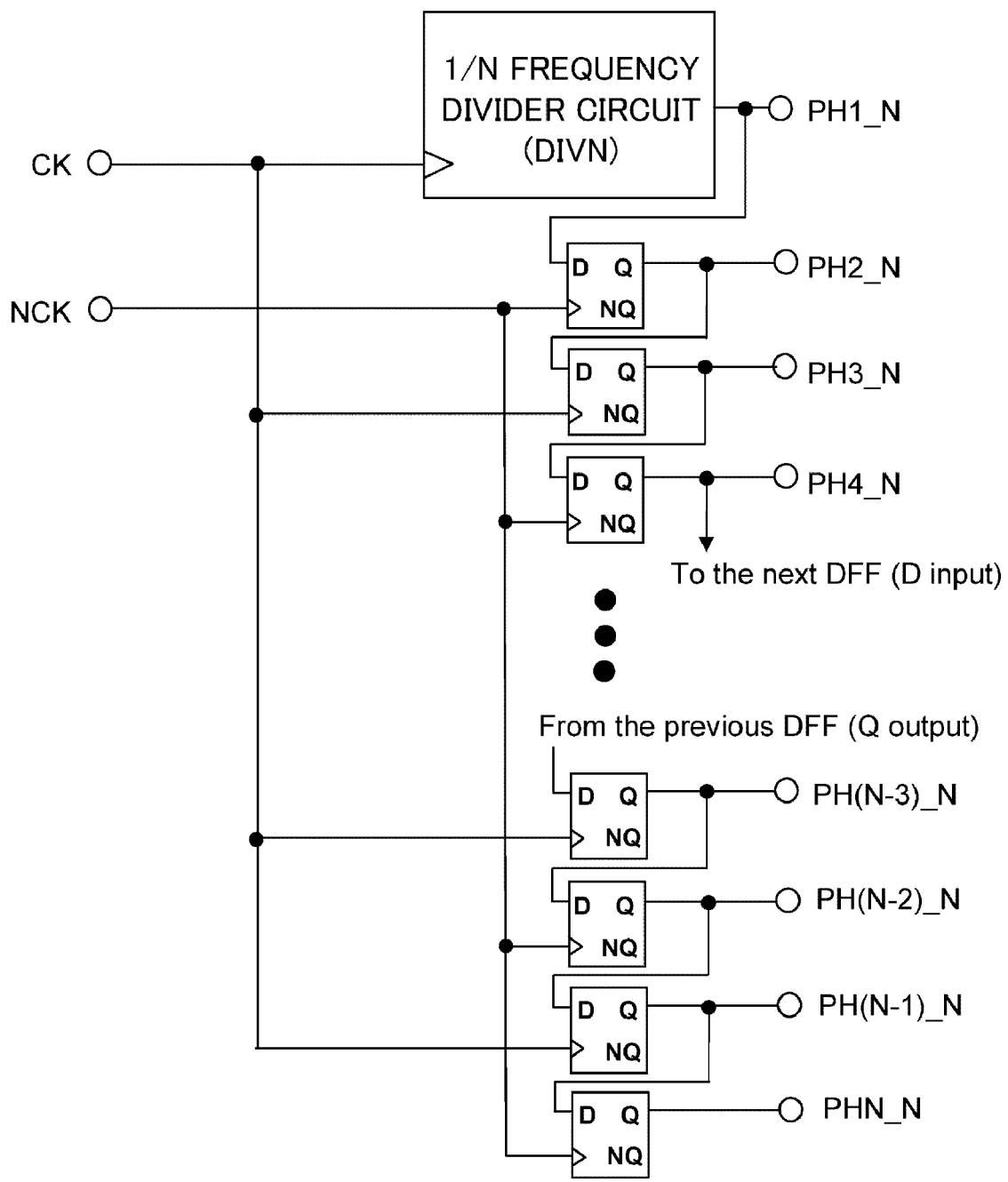
FIG. 12 illustrates a generalized circuit configuration of the example configurations of FIGS. 8 and 10.
Figure 13:
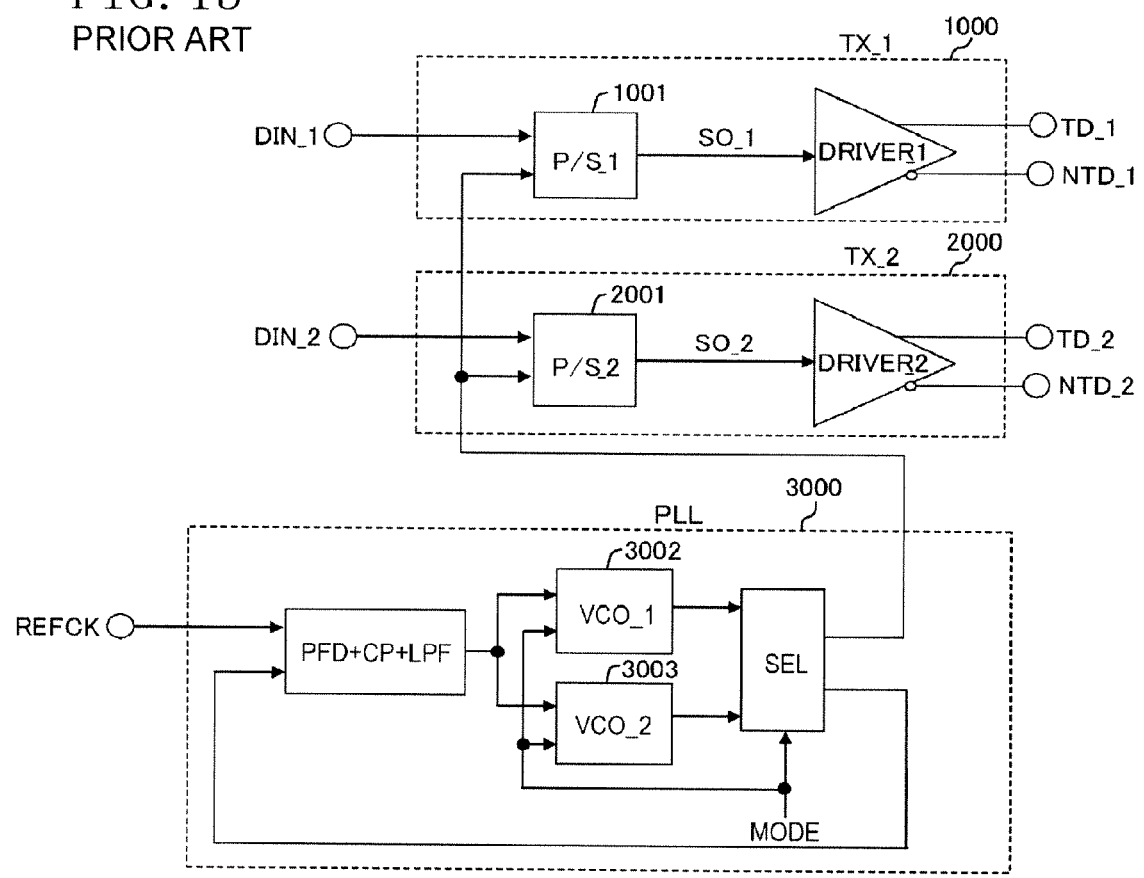
FIG. 13 is a diagram illustrating an example of a conventional circuit configuration.

FIG. 12 is a generalized diagram of the configurations of FIGS. 8 and 10, and illustrates an example configuration of a multiphase clock generator capable of generating an N-phase clock. Provision of a multiphase clock generator having such a circuit configuration allows a single multiphase VCO circuit to support various combinations of parallel-to-serial conversion. Although it is assumed here that the multiphase clock generator receives complementary normal and inverted clocks output from the multiphase VCO circuit, the configuration is not limited thereto, but a configuration such that the multiphase clock generator receives other clocks can be implemented.

In addition, although the above description has been directed to, by way of example, configurations which support the std-LVDS and the mini-LVDS standards, the present invention is not limited thereto, but the present invention may be applied to a hybrid configuration with other standards, and to a configuration supporting three or more standards.

Furthermore, although the above description has been provided assuming that, by way of example, there is only one data channel, the present invention is not limited thereto, but the present invention may be applied to a case of multiple channels.

The present disclosure allows a hybrid data transmission circuit to be implemented in a smaller circuit area and at a lower cost, and thus is useful for reduction in size and in cost of, for example, image processing LSIs in digital television sets.

What is claimed is:

1. A hybrid data transmission circuit, comprising:
    a data transmitter having a parallel-to-serial conversion function; and
    a PLL (phase-locked loop) circuit unit configured to supply a clock to the data transmitter,
    wherein
    the data transmitter includes
        a first parallel-to-serial conversion circuit configured to receive a first multiphase clock, and to perform parallel-to-serial conversion based on a first conversion ratio, and
        a second parallel-to-serial conversion circuit configured to receive a second multiphase clock, and to perform parallel-to-serial conversion based on a second conversion ratio, which is different from the first conversion ratio, and
    the PLL circuit unit includes
        a multiphase VCO (voltage-controlled oscillator) circuit configured to generate and output the first multiphase clock, and
        a multiphase clock generator configured to generate and output the second multiphase clock based on a clock output from the multiphase VCO circuit.

2. The hybrid data transmission circuit of claim 1, wherein the multiphase clock generator receives complementary normal and inverted clocks output from the multiphase VCO circuit, and includes
    a normal-clock frequency divider unit having a plurality of flip-flops, and configured to divide a frequency of the normal clock, and
    an inverted-clock frequency divider unit having a plurality of flip-flops, and configured to divide a frequency of the inverted clock.

3. The hybrid data transmission circuit of claim 2, wherein a data output terminal of a flip-flop which receives the normal clock in the normal-clock frequency divider unit and a data input terminal of a flip-flop which receives the inverted clock in the inverted-clock frequency divider unit are coupled together.

4. The hybrid data transmission circuit of claim 1, wherein the hybrid data transmission circuit is configured to be switchable between a first mode which uses the first parallel-to-serial conversion circuit, and a second mode which uses the second parallel-to-serial conversion circuit, by means of a mode switch signal, and
the PLL circuit unit fixes the second multiphase clock at Low-level or High-level in the first mode, and fixes the first multiphase clock at Low-level or High-level in the second mode.

5. The hybrid data transmission circuit of claim 1, wherein the hybrid data transmission circuit is configured to be switchable between a first mode which uses the first parallel-to-serial conversion circuit, and a second mode which uses the second parallel-to-serial conversion circuit, by means of a mode switch signal, and
the multiphase VCO circuit of the PLL circuit unit is configured such that an oscillation frequency can be switched depending on the mode switch signal.

6. The hybrid data transmission circuit of claim 1, wherein the multiphase clock generator is configured to be capable of generating a multiphase clock having more phases than a number of input clocks.

7. The hybrid data transmission circuit of claim 1, wherein the first conversion ratio is 7:1, and
the second conversion ratio is 4:1.

8. The hybrid data transmission circuit of claim 1, wherein the data transmitter includes
    a third parallel-to-serial conversion circuit configured to receive a third multiphase clock, and to perform parallel-to-serial conversion based on a third conversion ratio, which is different from the first and the second conversion ratios, and
the multiphase clock generator of the PLL circuit unit generates and outputs the third multiphase clock in addition to the second multiphase clock.

9. The hybrid data transmission circuit of claim 8, wherein the first conversion ratio is 7:1,
the second conversion ratio is 4:1, and
the third conversion ratio is 2:1.

* * * * *